(12) United States Patent
Evans

(10) Patent No.: US 6,201,726 B1
(45) Date of Patent: Mar. 13, 2001

(54) FERROELECTRIC MEMORY DEVICE STRUCTURE USEFUL FOR PREVENTING HYDROGEN LINE DEGRADATION

(75) Inventor: Thomas A. Evans, Colorado Springs, CO (US)

(73) Assignee: Ramtron International Corporation, Colorado Springs, CO (US)

( * ) Notice: Subject to any disclaimer, the term of this patent is extended or adjusted under 35 U.S.C. 154(b) by 0 days.

(21) Appl. No.: 09/588,153

(22) Filed: Jun. 5, 2000

Related U.S. Application Data

(62) Division of application No. 09/177,392, filed on Oct. 23, 1998.

(51) Int. Cl.⁷ .................................................. G11C 11/22
(52) U.S. Cl. .............................................. 365/145; 365/65
(58) Field of Search ...................................... 365/145, 65

(56) References Cited

U.S. PATENT DOCUMENTS

| | | | |
|---|---|---|---|
| 4,700,457 | 10/1987 | Matsukawa | 437/52 |
| 4,860,254 | 8/1989 | Pott et al. | 365/145 |
| 4,888,733 | 12/1989 | Mobley | 365/145 |
| 4,914,627 | 4/1990 | Eaton, Jr. et al. | 365/145 |
| 5,031,144 | 7/1991 | Persky | 365/145 |
| 5,119,154 | 6/1992 | Gnadinger | 357/23.6 |
| 5,122,477 | 6/1992 | Wolters et al. | 437/60 |
| 5,155,573 | 10/1992 | Abe et al. | 357/51 |
| 5,192,704 | 3/1993 | McDavid et al. | 437/52 |
| 5,273,927 | 12/1993 | Gnadinger | 437/52 |
| 5,293,075 | 3/1994 | Onishi et al. | 257/769 |
| 5,293,510 | * 3/1994 | Takenata | 257/295 |
| 5,303,186 | 4/1994 | Yamauchi | 365/145 |
| 5,335,138 | 8/1994 | Sandhu et al. | 361/303 |
| 5,350,705 | 9/1994 | Brassington et al. | 257/295 |
| 5,371,700 | 12/1994 | Hamada | 365/149 |
| 5,375,085 | 12/1994 | Gnade et al. | 365/145 |
| 5,382,817 | 1/1995 | Kashihara et al. | 257/295 |
| 5,383,150 | 1/1995 | Nakamura et al. | 365/145 |
| 5,390,143 | 2/1995 | Manning | 365/145 |
| 5,396,095 | 3/1995 | Wolters et al. | 257/310 |
| 5,416,735 | 5/1995 | Onishi et al. | 365/145 |
| 5,438,023 | 8/1995 | Argos et al. | 437/235 |
| 5,440,173 | 8/1995 | Evans, Jr. et al. | 257/751 |
| 5,475,248 | 12/1995 | Takenaka | 257/295 |
| 5,481,490 | 1/1996 | Wantanabe et al. | 365/145 |
| 5,495,117 | * 2/1996 | Larson | 257/295 |
| 5,536,672 | 7/1996 | Miller et al. | 437/52 |
| 5,554,559 | 9/1996 | Wolters et al. | 437/62 |

(List continued on next page.)

Primary Examiner—Vu A. Le
Assistant Examiner—Tuan T. Nguyen
(74) Attorney, Agent, or Firm—Peter J. Meza, Esq.

(57) ABSTRACT

A ferroelectric capacitor stack for use with an integrated circuit transistor in a ferroelectric memory cell is fabricated by: forming a first dielectric layer over the integrated circuit transistor; forming a bottom electrode over the first dielectric layer, the bottom electrode having a hole located over a first source/drain of the integrated circuit transistor; forming a second dielectric layer over the first dielectric layer and bottom electrode; forming a hole in the second dielectric layer to provide access to the bottom electrode; forming a ferroelectric plug in the hole in the second dielectric layer; forming a top electrode over the second dielectric layer and ferroelectric plug; forming a third dielectric layer over the second dielectric layer and top electrode; forming a first via through the first, second, and third dielectric layers, and through the hole in the bottom electrode, the via having sufficient width to provide access to a lateral edge of the bottom electrode hole; forming a second via through the first, second, and third dielectric layers to provide access to a second transistor source/drain; forming a third via through the third dielectric layer to provide access to the top electrode; metalizing the first via; metalizing the second via; and metalizing the third via.

7 Claims, 17 Drawing Sheets

U.S. PATENT DOCUMENTS

| | | | |
|---|---|---|---|
| 5,638,319 | 6/1997 | Onishi et al. | 365/145 |
| 5,679,969 | 10/1997 | Evans, Jr. et al. | 257/295 |
| 5,696,394 | 12/1997 | Jones, Jr. et al. | 257/295 |
| 5,716,875 | 2/1998 | Jones, Jr. et al. | 438/3 |
| 5,804,850 | * 9/1998 | Evan, Jr. et al. | 257/295 |
| 5,838,605 | * 11/1998 | Bailey | 365/145 |
| 5,963,466 | * 10/1999 | Evans, Jr. | 365/145 |

* cited by examiner

FERROELECTRIC MEMORY DEVICE STRUCTURE USEFUL FOR PREVENTING HYDROGEN LINE DEGRADATION

The present application is a divisional application of co-pending U.S. patent application Ser. No. 09/177,392, filed Oct. 23, 1998.

BACKGROUND OF THE INVENTION

This invention relates generally to ferroelectric memories. More particularly, the present invention relates to a method of fabricating a ferroelectric capacitor stack (bottom electrode, ferroelectric dielectric, top electrode) for use in an integrated circuit ferroelectric memory.

In general, prior art integrated circuit ferroelectric memories have two major problems. One of these problems is increased surface topology, which leads to manufacturability problems such as metal step coverage and the like. The second problem is related to "line degradation", which generally refers to the loss of functionality primarily due to damage experienced by the ferroelectric capacitor dielectric during the many processing steps required to fabricate a packaged ferroelectric memory. A main source of the damage can be traced to exposure of the ferroelectric capacitor dielectric to hydrogen. Prior art structures and methods of dealing with hydrogen exposure and the resultant damage and loss of functionality included placing barrier materials such as PZT or other barrier materials directly over the ferroelectric capacitor. While these prior art methods somewhat reduced line degradation, they can become compromised when the contact to the top electrode is formed. The top electrode contact becomes the entrance of a pathway for hydrogen to still attack the ferroelectric dielectric layer that is located laterally beneath the top electrode.

What is desired is a device structure for an integrated circuit ferroelectric memory that is both planar and insensitive to hydrogen-induced line degradation.

SUMMARY OF THE INVENTION

It is, therefore, a principal object of the present invention to construct a compact and manufacturable ferroelectric capacitor stack for use in an integrated circuit ferroelectric memory.

It is an advantage that the capacitor stack structure of the present invention does not require a top electrode contact laterally located over the switching ferroelectric layer, and therefore line degradation is significantly minimized.

It is another advantage of the invention that bottom electrode contact to the transistor source/drain is made after high temperature annealing, which helps to prevent silicon poisoning of the bottom electrode.

It is another advantage of the present invention that the resultant ferroelectric memory structure has reduced surface topology because of the planarizing nature of the deposition technology used in at least one of the layers such as CSD (chemical solution deposition) or MOCVD metalorganic chemical vapor deposition).

It is another advantage of the present invention that a ferroelectric capacitor can be formed directly over a planarized transistor source/drain when an appropriate barrier material is included to prevent interaction of the bottom electrode and the transistor contact structure.

According to a first method of the present invention, a ferroelectric capacitor stack for use with an integrated circuit transistor in a ferroelectric memory cell is fabricated by: forming a first dielectric layer over the integrated circuit transistor; forming a bottom electrode over the first dielectric layer, the bottom electrode having a hole located over a first source/drain of the integrated circuit transistor; forming a second dielectric layer over the first dielectric layer and bottom electrode; forming a hole in the second dielectric layer to provide access to the bottom electrode; forming a ferroelectric plug in the hole in the second dielectric layer; forming a top electrode over the second dielectric layer and ferroelectric plug; forming a third dielectric layer over the second dielectric layer and top electrode; forming a first via through the first, second, and third dielectric layers, and through the hole in the bottom electrode, the via having sufficient width to provide access to a lateral edge of the bottom electrode hole; forming a second via through the first, second, and third dielectric layers to provide access to a second transistor source/drain; forming a third via through the third dielectric layer to provide access to the top electrode; metalizing the first via; metalizing the second via; and metalizing the third via.

A second method of the present invention is similar to the first method, wherein the hole in the second dielectric layer may be sloped, if desired.

According to a third method of the present invention, a ferroelectric capacitor stack for use with an integrated circuit transistor in a ferroelectric memory cell is fabricated by: forming a first planarized dielectric layer over the integrated circuit transistor; forming first and second vias in the first planarized dielectric layer to provide access to first and second source/drains of the integrated circuit transistor; forming first and second metal plugs in the first and second vias, respectively; forming a bottom electrode over the second metal plug; forming a second planarized dielectric layer over the first planarized dielectric layer and bottom electrode; forming a hole in the second dielectric layer to provide access to the bottom electrode; forming a ferroelectric plug in the hole in the second dielectric layer; forming a top electrode over the second dielectric layer and ferroelectric plug; forming a third planarized dielectric layer over the second dielectric layer and top electrode; forming a first via through the second and third planarized dielectric layers to provide access to the first metal plug; forming a second via through the third planarized dielectric layer to provide access to the top electrode; metalizing the first via; and metalizing the second via.

According to a fourth method of the present invention, a ferroelectric capacitor stack for use with an integrated circuit transistor in a ferroelectric memory cell is fabricated by: forming a first planarized dielectric layer over the integrated circuit transistor; forming first and second vias in the first planarized dielectric layer to provide access to first and second source/drains of the integrated circuit transistor; forming first and second metal plugs in the first and second vias, respectively; forming a second planarized dielectric layer over the first planarized dielectric layer and first and second metal plugs; forming a bottom electrode over the second planarized dielectric layer, the bottom electrode having a hole located over the second metal plug; forming a ferroelectric layer on the bottom electrode; forming a patterned third planarized dielectric layer having a hole to provide access to the ferroelectric layer; forming a top electrode over the ferroelectric layer; forming a fourth planarized dielectric layer over the third dielectric layer and top electrode; forming a first via through the second, third, and fourth planarized dielectric layers to provide access to the first metal plug; forming a second via through the second, third, and fourth planarized dielectric layers, and through the hole in the bottom electrode, the via having sufficient width to provide access to a lateral edge of the bottom electrode hole; forming a third via through the third planarized dielectric to provide access to the top electrode; metalizing the first via; metalizing the second via; and metalizing the third via.

According to a fifth method of the present invention, a ferroelectric capacitor stack for use with an integrated circuit transistor in a ferroelectric memory cell is fabricated by: forming a first dielectric layer over the integrated circuit transistor; forming a bottom electrode over the first dielectric layer, the bottom electrode having a hole located over a first source/drain of the integrated circuit transistor; forming a ferroelectric layer on the bottom electrode; forming a second dielectric layer over the first dielectric layer and bottom electrode; forming a hole in the second dielectric layer to provide access to the ferroelectric layer; forming a top electrode over the ferroelectric layer; forming a planarized dielectric layer over the second dielectric layer and top electrode; forming a first via through the first, second, and planarized dielectric layers to provide access to the first source/drain; forming a second via through the first, second, and planarized dielectric layers, and through the hole in the bottom electrode, the via having sufficient width to provide access to a lateral edge of the bottom electrode hole; forming a third via through the planarized dielectric layer to provide access to the top electrode; metalizing the first via; metalizing the second via; and metalizing the third via.

According to a sixth method of the present invention, a ferroelectric capacitor stack for use with an integrated circuit transistor in a ferroelectric memory cell is fabricated by: forming a bottom electrode over a first source/drain of the integrated circuit transistor; forming a first planarized dielectric layer over the integrated circuit transistor and bottom electrode; forming a hole in the first dielectric layer to provide access to the bottom electrode; forming a ferroelectric plug in the hole in the first dielectric layer; forming a top electrode over the ferroelectric plug and first dielectric layer; forming a second planarized dielectric layer over the first planarized dielectric layer and top electrode; forming a first via through the first and second planarized dielectric layers to provide access to a second source/drain; forming a second via through the second planarized dielectric layer to provide access to the top electrode; metalizing the first via; and metalizing the second via.

After the top electrode is formed in each of the methods of the present invention, an optional ferroelectric encapsulation layer may be formed. This layer serves as a hydrogen barrier, and may patterned to be coextensive with the capacitor ferroelectric layer, to overlap the top electrode, or to cover the entire surface of the ferroelectric memory, if desired.

The foregoing and other objects, features and advantages of the invention will become more readily apparent from the following detailed description of a preferred embodiment of the invention which proceeds with reference to the accompanying drawings.

DETAILED DESCRIPTION

Figure 1:
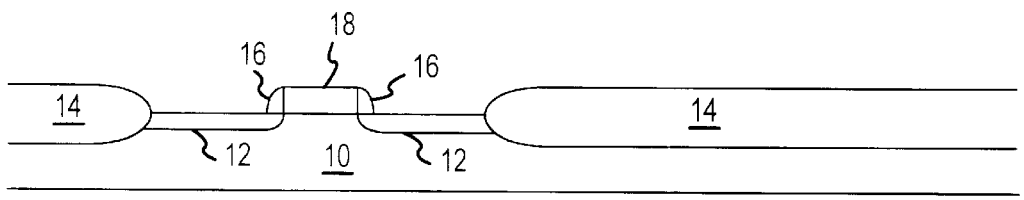
FIGS. 1–11 are cross-sectional views of an integrated circuit memory cell being formed according to a first method of the present invention.

Referring now to FIG. 1, an integrated circuit transistor is shown including a silicon or other suitable substrate 10, transistor source/drains 12, 3500–4500 Angstrom thick field oxide isolation 14, sidewall spacers 16, and polysilicon gate 18.

Figure 2:
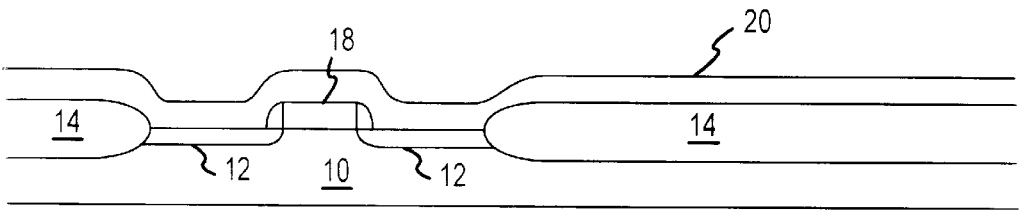

In FIG. 2, a first dielectric layer 20 is formed over the integrated circuit transistor. Layer 20 can be any suitable dielectric material, but is preferably BPSG (borophosphosilicate glass), deposited to a thickness of about 5000 Angstroms. Layer 20 can be formed by conventional methods such as PECVD (plasma-enhanced chemical vapor deposition).

Figure 3:
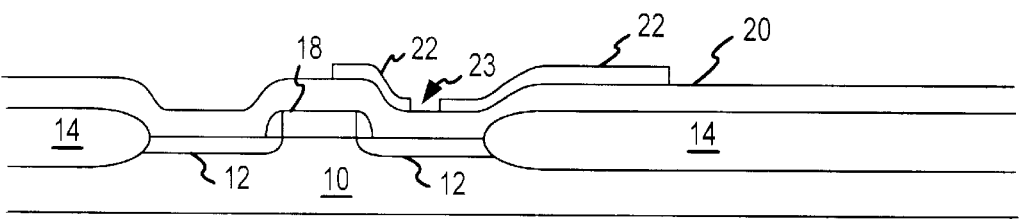
Figure 3A:
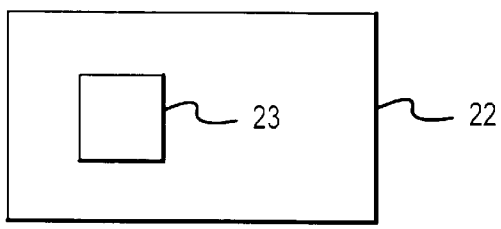
FIG. 3A is a plan view of a bottom electrode used in the first method of the present invention.

In FIG. 3, a bottom electrode 22 is formed over the first dielectric layer 20, the bottom electrode 22 having a hole 23 located over one of the source/drains 12 of the integrated circuit transistor. The bottom electrode 22 can be formed of any ferroelectric-compatible electrode material, but is preferably a 100–250 Angstrom thick adhesion layer of titanium sandwiched to a 1000–1750 Angstrom thick layer of platinum. It is also known by those skilled in the art that iridium or iridium-oxide based electrode materials are also suitable. In FIG. 3A a plan view of bottom electrode 22 is shown, revealing the full lateral dimensions of hole 23 for providing access to source/drain 12 later in the process flow as is explained in greater detail below. Bottom electrode 22 is preferably formed by sputtering and can be patterned by plasma etching.

Figure 4:
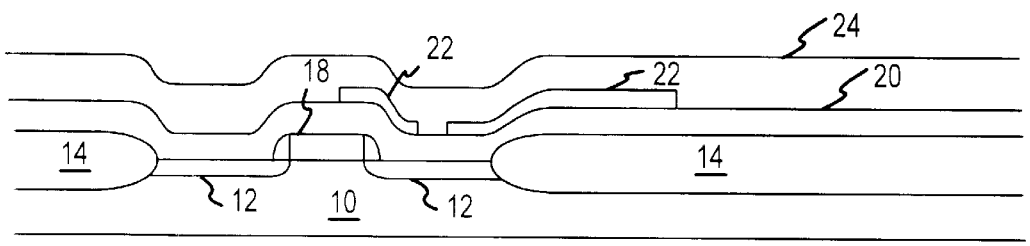

Referring now to FIG. 4 a second dielectric layer 24 is formed over the first dielectric layer 20 and bottom electrode 22. Layer 24 can be any dielectric material, but is preferably $Al_2O_3$ (alumina). Other materials such as TEOS (tetraethylorthosilicate glass), PTOS (phosphorous doped TEOS), or SiN (silicon nitride) can also be used. Layer 24 is preferably deposited to a thickness of about 1000–3000 Angstroms. Layer 24 can be formed by either PECVD or sputtering.

Figure 5:
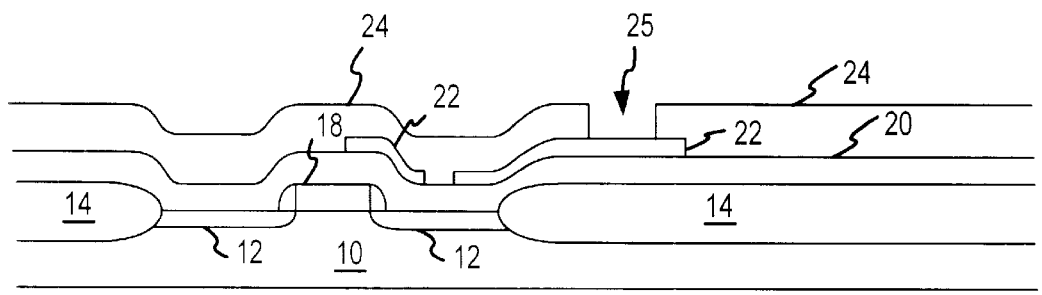

In FIG. 5, a hole or via 25 is formed in the second dielectric layer 24 to provide access to the bottom electrode 22. Note that hole 25 is placed on the portion of the bottom electrode 22 that rests over the thick field oxide layer 14. Hole 25 can be formed by conventional etching methods such as plasma etching.

Figure 6:
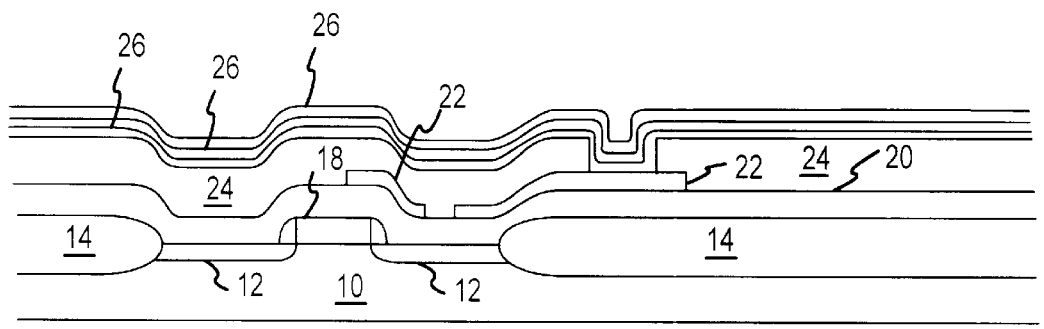
Figure 7:
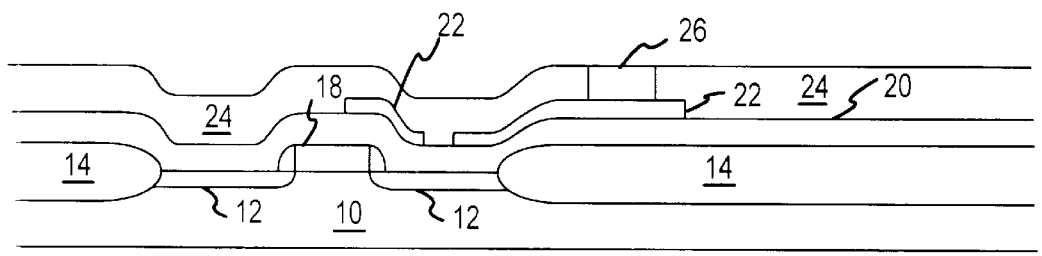

In FIGS. 6 and 7 a ferroelectric plug 26 is formed in the hole 25 in the second dielectric layer 24. The ferroelectric plug 26 is formed by depositing multiple ferroelectric layers 26 over the second dielectric layer 24 to a thickness sufficient to fill the hole 25 in the second dielectric layer 24. The ferroelectric material used is ideally PZT (lead-zirconate-titanate) or PLZT (lead-lanthanum-zirconate-titanate), either doped or undoped. However, other suitable ferroelectric materials can be used such as SBT (strontium bismuth tantalate) or BST (bismuth titanate). Each layer 26 is about 500 Angstroms thick and is ideally deposited using a CSD (chemical solution deposition) process. In FIG. 7, the excess material in the multiple ferroelectric layers 26 above the surface of the second dielectric layer 24 is removed. Ferroelectric layers 26 are preferably removed using CMP (chemical-mechanical polishing) such that the only ferroelectric material remaining is in the opening 25 in dielectric layer 24.

Perovskite crystal formation necessary for achieving switching in ferroelectric plug 26 is achieved by an appropriate annealing step such as baking at 650° C. about an hour in an oxygen environment. Preferably, the Perovskite crystal formation through annealing is achieved before the excess material in the multiple ferroelectric layers 26 is removed through CMP as shown in FIG. 6. If desired, the anneal can be performed alternatively after the ferroelectric plug 26 has been formed as shown in FIG. 7.

Figure 8:
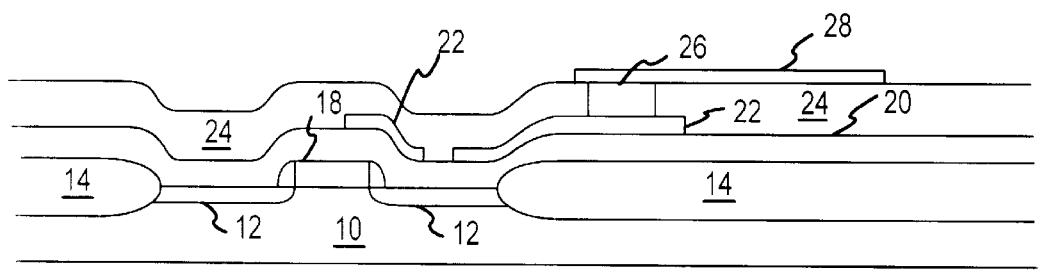

In FIG. 8, a top electrode 28 is formed over the second dielectric layer 24 and ferroelectric plug 26. The top electrode 28 makes electrical contact with ferroelectric plug 26 and includes a portion that extends away from ferroelectric plug 26 along the surface of dielectric layer 24. It should be noted that a lateral separation (either along the plane of the figure as shown in FIG. 8, or othogonal thereto as shown in the plan view of FIG. 10A) of about five microns or more is desirable for maximum hydrogen immunity and peak switching performance. A longer lateral separation can be used but additional integrated circuit die area will be consumed. Top electrode 28 is ideally formed using platinum, iridium, or a composite thereof to a thickness of about 1000–2000 Angstroms. Top electrode 28 is preferably patterned using plasma etching.

After the top electrode 28 is formed and patterned, a "recovery" anneal is performed to rejuvenate the switching properties of the ferroelectric material in plug 26. A suitable recovery anneal is performed at 550° C. for about one hour in an oxygen environment.

Figure 9:
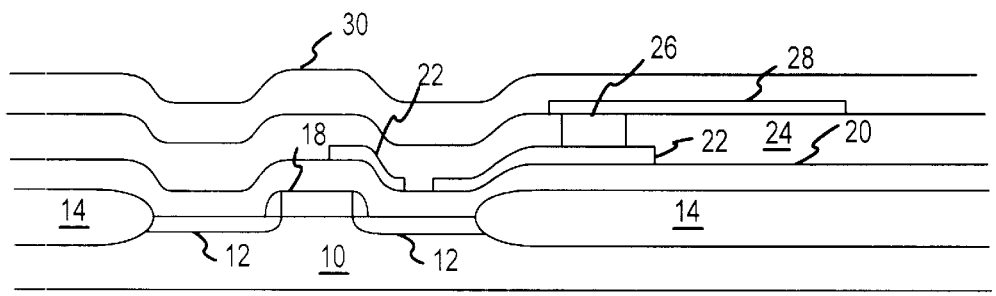

In FIG. 9, a third dielectric layer 30, designated an "FEO" layer, for "ferroelectric oxide" layer is deposited over the second dielectric layer 24 and top electrode 28. The FEO dielectric layer 30 can be silicon oxide, silicon nitride, either doped or undoped, and is deposited to a thickness of about 1500–3500 Angstroms. Layer 30 is typically deposited using PECVD.

Figure 10:
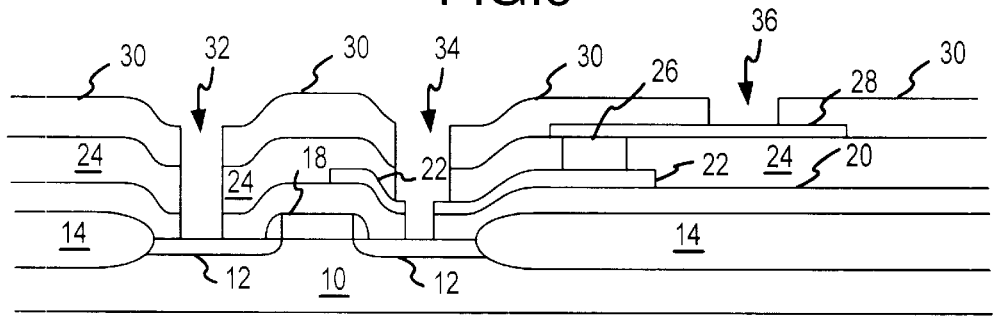
Figure 10A:
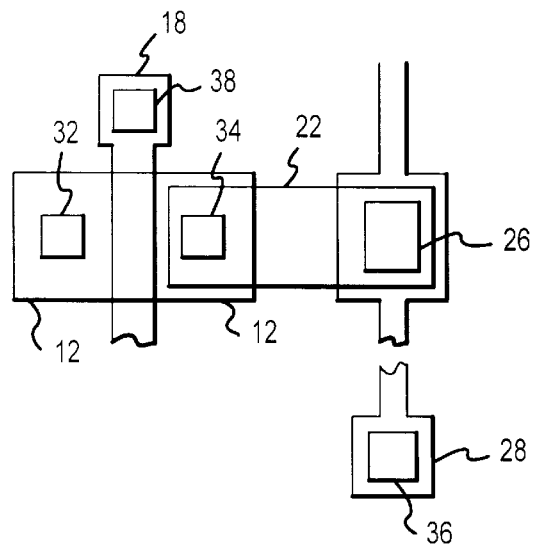
FIG. 10A is a plan view of the completed memory cell formed according to the first method of the present invention.

In FIG. 10, a contact mask is applied and contacts are etched to the source/drains 12 of the integrated circuit transistor, top electrode 28, and polysilicon gate 18 (contact 38 to polysilicon gate 18 is shown in FIG. 10A). A first via 34 is formed through the first, second, and third dielectric layers 20, 24, and 30, and through the hole in the bottom electrode 22. Note that via 34 must have sufficient width to provide access to a lateral edge of the bottom electrode hole 22. This is necessary because subsequent metalization of via 34 provides a shorting strap and electrical connection between bottom electrode 22 and source/drain 12 of the integrated circuit transistor. The electrical connection is the internal node of a 1T/1C ferroelectric memory cell, forming the internal electrical connection between the ferroelectric capacitor and transistor. A second via 32 is formed through the first, second, and third dielectric layers 20, 24, and 30, to provide access to a second transistor source/drain 12. A third via 36 is formed through the third dielectric layer 30 to provide access to the top electrode 28. A contact 38 shown in FIG. 10A is also formed to the polysilicon gate 18. Vias 32, 34, 36, and contact 38 can be formed simultaneously using plasma etching.

A plan view of the completed ferroelectric memory cell is shown in FIG. 10A including the transistor active area 12, which forms the source/drains of the integrated circuit transistor, polysilicon gate 18, bottom electrode 22, ferroelectric plug 26, and top electrode 28. Also shown are vias 32 and 34, polysilicon contact 38 and top electrode via 36, both of which may be made orthogonal to the cross-sectional plane of FIG. 10. While the preferred layout configuration for the memory cell is shown in FIG. 10A, it will be appreciated by those skilled in the art that other layout configurations can be used for the same memory cell structure, if desired.

In FIG. 1 the first via 34 is metalized to form the internal memory cell contact and shorting strap 42, second via 32 is metalized to form the bit line contact 40 of the cell, third via 36 is metalized to form the plate line contact 44 of the cell, and polysilicon contact 38 is metalized (not shown in FIG. 11) to form the word line contact of the cell. The metalization used is a thin 300–1000 Angstrom layer of titanium nitride, followed by a layer of aluminum approximately 3000–8000 Angstroms thick. Metal formation is achieved by sputtering from two targets. The metalization is then patterned using plasma etching.

Figure 11:
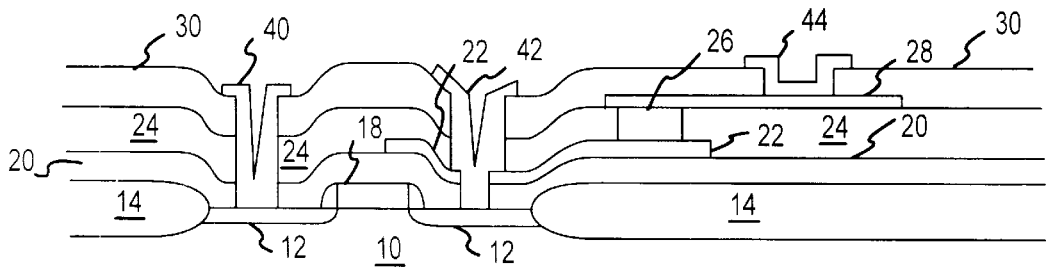
Figure 12:
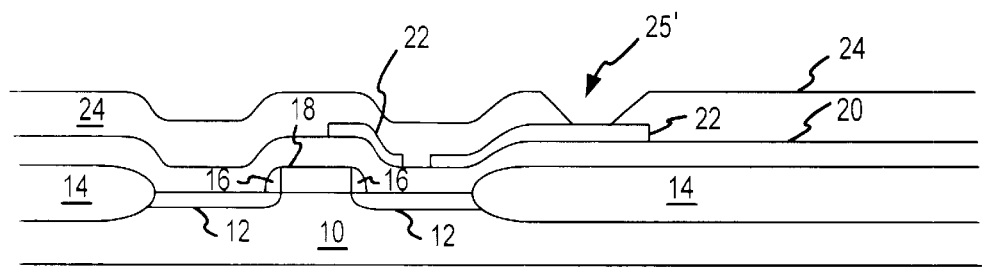
FIGS. 12–18 are cross-sectional views of an integrated circuit memory cell being formed according to a second method of the present invention.

Not shown in FIG. 11 are subsequent processing steps including passivation and additional optional metal layers. Standard multi-layer metal processing, as well as standard oxide or nitride passivation layers can be used. If desired, more sophisticated passivation layers such as ferroelectric passivation or combination passivation layers may also be used.

Figure 13:
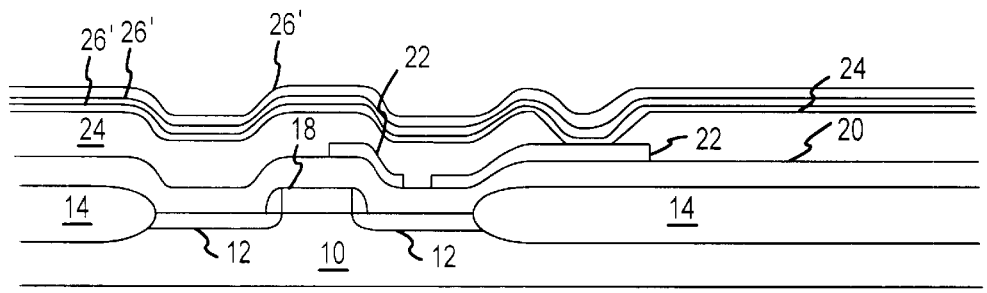
Figure 14:
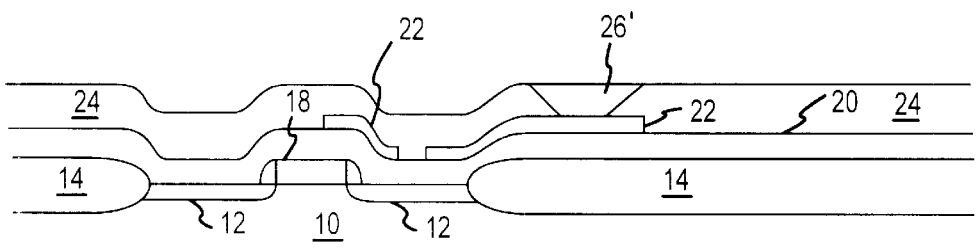
Figure 15:
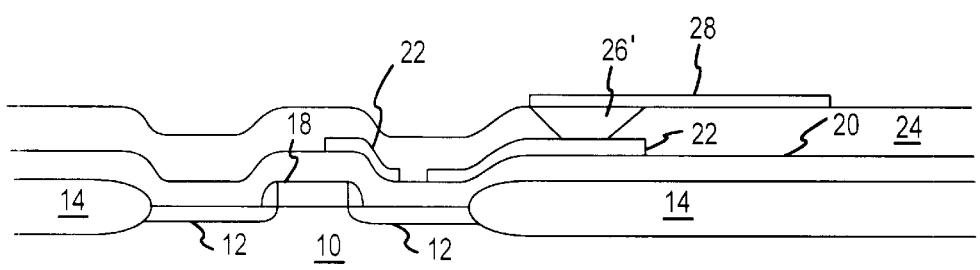
Figure 16:
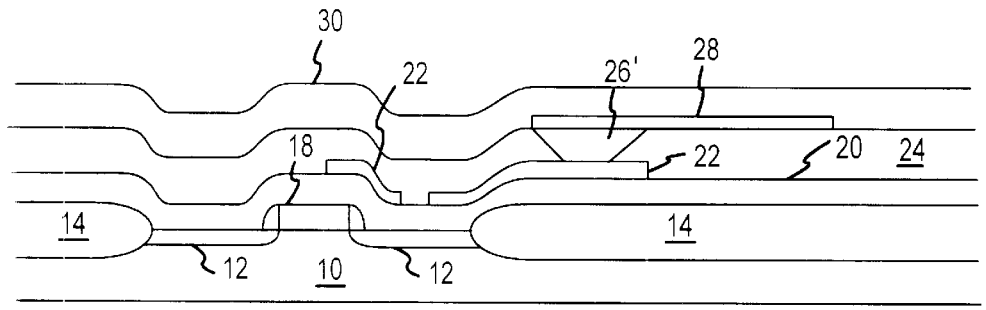
Figure 17:
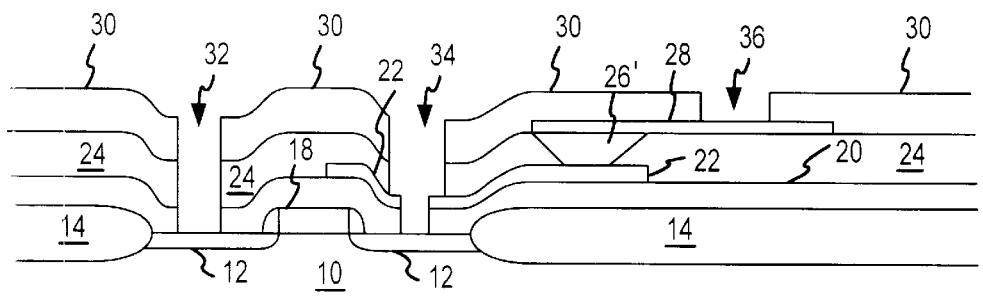
Figure 18:
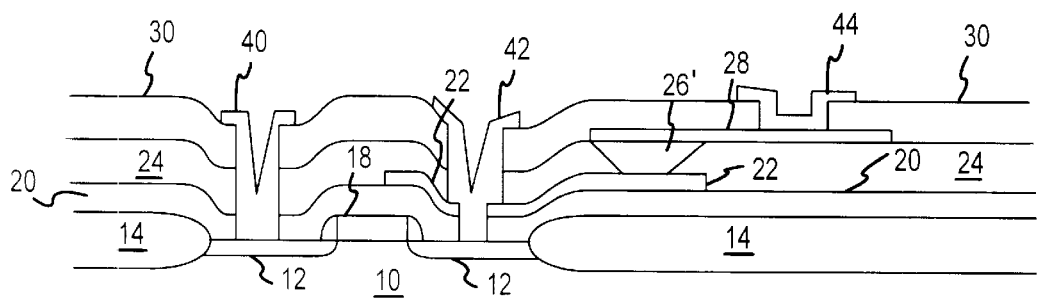

The first method of forming a capacitor stack according to the present invention is illustrated in FIGS. 1–11. A second method that may be easier to fabricate is illustrated in FIGS. 12–18, which generally corresponds to the drawing figures of the first method. However, in the second method described in greater detail below, the step of forming a hole 25 in the second dielectric layer 24 is changed to forming a V-shaped hole 25' having sloping sides. The sloping sides on hole 25 can be used to facilitate the formation of a V-shaped ferroelectric plug 26' as shown in FIG. 14. The sloping sides on hole 25' shown in FIG. 12 can be formed by plasma etching or by wet etching. In FIG. 13, the ferroelectric layers 26' are shown as conformally coating dielectric layer 24, without the sharp corners seen in previous corresponding FIG. 6. In FIG. 14, the excess ferroelectric material in layers 26' are removed to leave a V-shaped ferroelectric plug 26'. In FIG. 15, a top electrode 28 is formed, the dimensions of which are set to completely contact all of the top surface of ferroelectric plug 26', with a portion of electrode 28 extending over dielectric layer 24. In FIG. 16, dielectric layer 30 is formed, in FIG. 17 vias 32, 34, and 36 are formed, and in FIG. 18 the vias are metalized, all substantially as described above.

Figure 19:
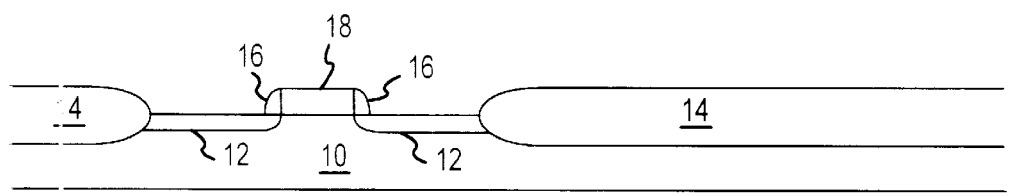
FIGS. 19–31 are cross-sectional views of an integrated circuit memory cell being formed according to a third method of the present invention.

A third method of forming a ferroelectric capacitor stack for use with an integrated circuit transistor in a ferroelectric memory cell is described below and illustrated in FIGS. 19–31. FIG. 19 is identical to previous FIG. 1, showing a CMOS integrated circuit transistor having a silicon substrate 10, source/drain regions 12, thick field oxide isolation layers 14, sidewall spacers 16, and a polysilicon gate 18, which extends orthogonally to the plane of the FIG. 19.

Figure 20:
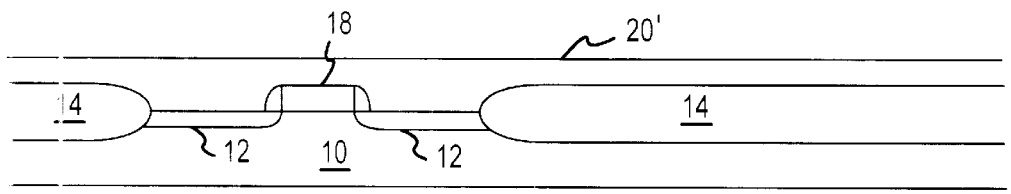

In FIG. 20 a first planarized dielectric layer 20' is formed over the integrated circuit transistor. The material used is the same as previously described, i.e. BPSG, and the thickness is roughly the same, i.e. about 5000 Angstroms. Planarization can be achieved by the use of "SOG" (spin-on glass), SOG with etch back, or CMP (chemical-mechanical-polishing).

Figure 21:
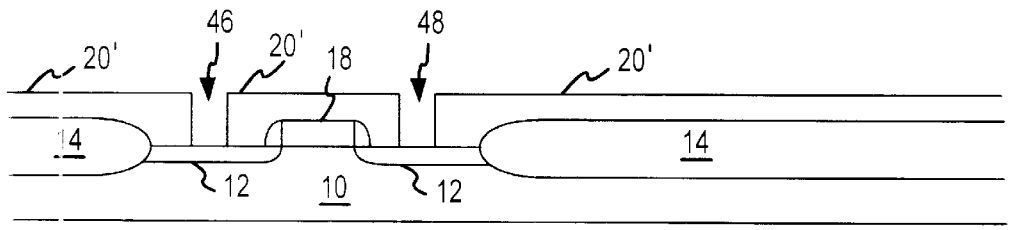

In FIG. 21, first and second vias 46 and 48 are formed in the first planarized dielectric layer 20' to provide access to first and second source/drains 12 of the integrated circuit transistor. Preferably, vias 46 and 48 are formed by plasma etching.

Figure 22:
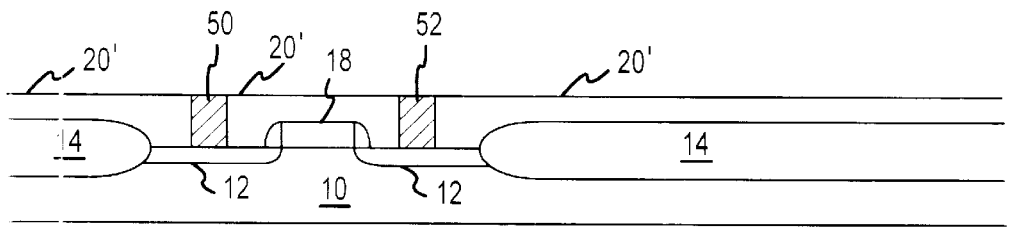

In FIG. 22 first and second metal plugs 50 and 52 are formed in the first and second vias 46 and 48, respectively. Metal plugs 50 and 52 are ideally formed of tungsten, aluminum, or other suitable metals or conductive materials. Metal plugs 50 and 52 are ideally formed by coating the etched dielectric layer 20' with one or more layers of metal sufficient to fully fill vias 46 and 48 with metal. The excess material above the top surface of dielectric layer 20' is removed through either etching back the material with a plasma etch, or by chemical-mechanical polishing.

Figure 23:
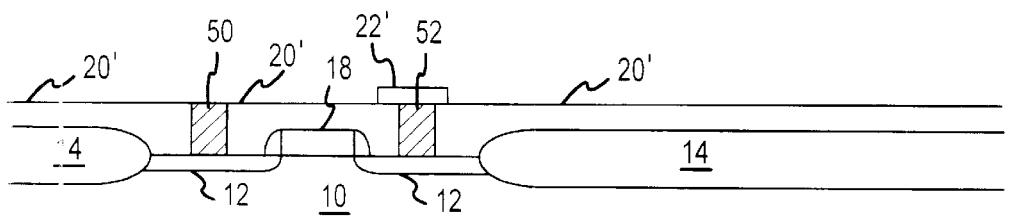

In FIG. 23 the bottom electrode 22' is formed over the second metal plug 52. The same method of forming the bottom electrode and same bottom electrode platinum/titanium material is used generally as before. Note, however, that bottom electrode 22' is a standard patterned contact for electrically contacting metal plug 52 and does not have a patterned hole as before. A dummy "bottom electrode" may be provided for metal plug 50. The dummy bottom electrode may be useful if electrical contact problems are experienced in forming contact 40 in FIG. 31 as will be explained in further detail below.

The bottom electrode 22' should include a conductive barrier layer along the interface between the bottom surface of bottom electrode 22' and the top surface of metal plug 52. Auitable barrier material is titanium nitride or aluminum titanium nitride. The conductive barrier layer is used to prevent the mixing of the platinum bottom electrode 22' and the metal plug 52 while maintaining good conductivity therebetween.

Figure 24:
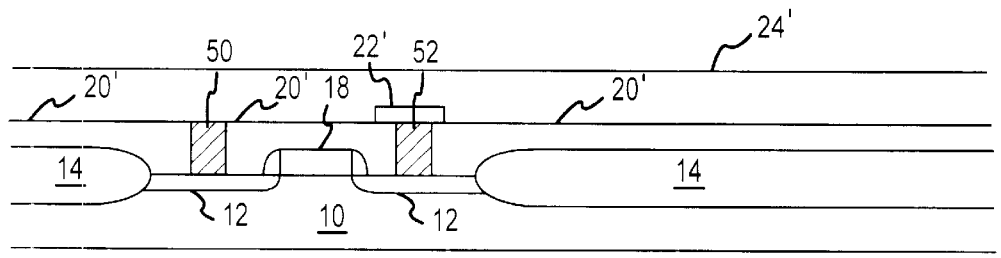

In FIG. 24, a second planarized dielectric layer 24' is formed over the first planarized dielectric layer 20' and bottom electrode 22'. The same materials used in previous dielectric layer 24 may be used in planarized dielectric 24'. The same thickness of material may also be used, i.e. about 1000–3000 Angstroms.

Figure 25:
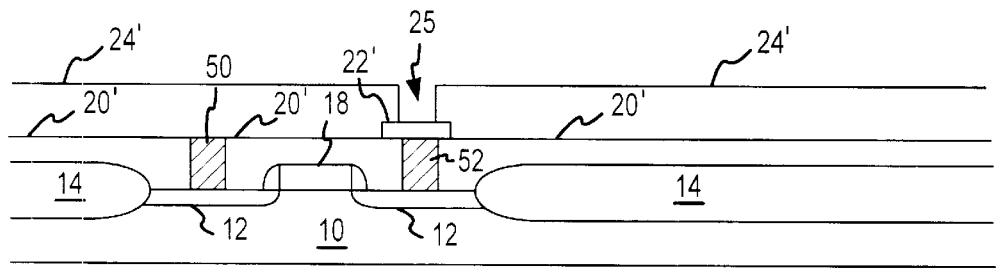

In FIG. 25, a hole 25 is formed in the second dielectric layer 24' to provide access to the bottom electrode 22'. The hole 25 may be etched as previously described. Hole 25 may have trench sidewalls as shown in FIG. 25, or may have sloping sidewalls as previously described and shown in FIG. 12.

Figure 26:
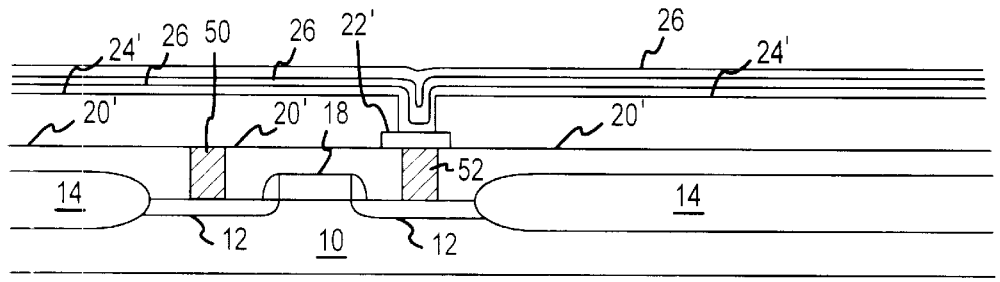

Turning now to FIG. 26, a ferroelectric plug is formed in the hole 25 in the second dielectric layer 24', using the previously described ferroelectric materials. Again, the hole can be filled by using multiple ferroelectric layers 26 for ease of manufacturability and for better coverage in the sidewalls of hole 25. Perovskite crystal formation is preferably achieved at this point in the process using an anneal at a temperature of about 650° C. in an oxygen environment for about an hour.

Figure 27:
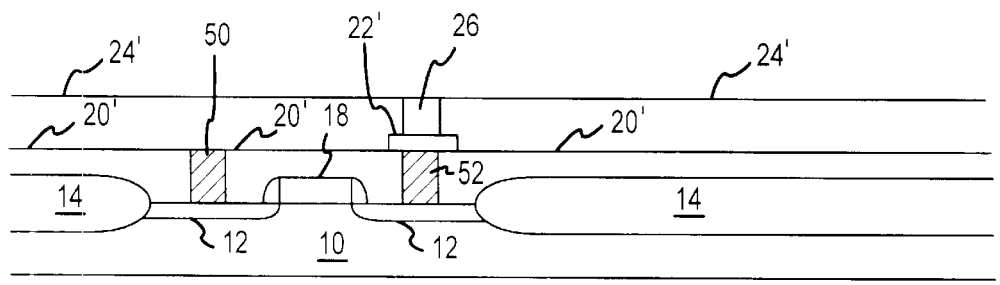

In FIG. 27 the excess ferroelectric layer material is removed by CMP or the like to form ferroelectric plug 26. The Perovskite crystal formation anneal can be optionally performed after the ferroelectric plug 26 is formed and the excess ferroelectric material removed.

Figure 28:
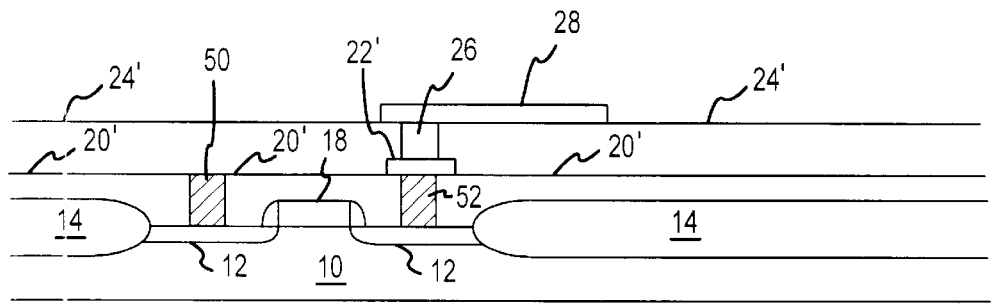

In FIG. 28 a platinum top electrode 28 is formed over the ferroelectric plug 26 and extends laterally over the second dielectric layer 24'. An optional recovery anneal can be performed after the top electrode 28 is formed using an anneal at a temperature of about 550° C. in an oxygen environment for about an hour.

Figure 29:
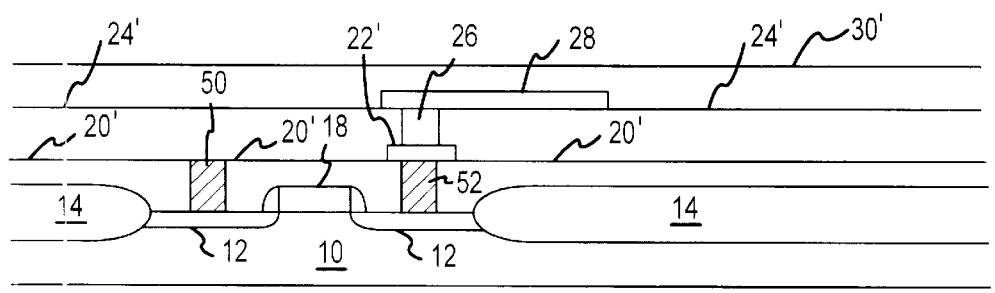

In FIG. 29 a third planarized dielectric layer 30' is formed over the second dielectric layer 24' and top electrode 28. The dielectric 30' is formed of silicon oxide or nitride as previously described, and is formed by PECVD, and planarized by SOG or CMP, if necessary.

Figure 30:
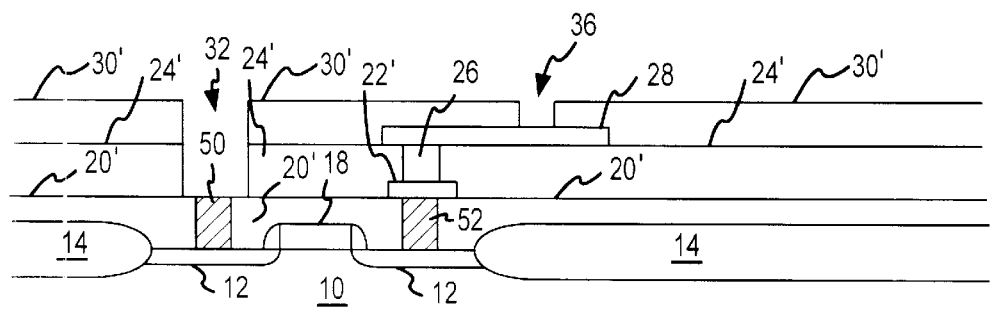

In FIG. 30, a first via 32 is etched through the second and third planarized dielectric layers 24' and 30' to provide access to the first metal plug 50. A second via 34 is etched through the third planarized dielectric layer 30' to provide access to the top electrode 28. The vias are preferably formed using "dry etching", which is generally defined as plasma etching. Also, a polysilicon gate contact 18 is also formed, but is not shown in FIG. 30, since the contact is made orthogonal to the plane of FIG. 30. Note that in FIG. 30, there is no via necessary to form the internal node of the ferroelectric memory cell. The internal node forming the connection between the ferroelectric capacitor (ferroelectric plug 26) and integrated circuit transistor (source/drain 12) consists only of metal plug 52 and bottom electrode/conductive barrier layer 22'.

Figure 30A:
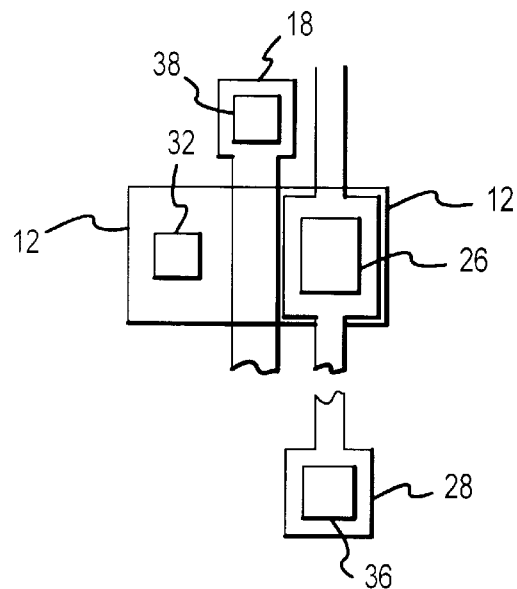
FIG. 30A is a plan view of the completed memory cell formed according to the third method of the present invention.

A plan view of the finished, but unmetalized, memory cell structure is shown in FIG. 30A. The active area 12 forming the source/drains of the integrated circuit transistor, polysilicon gate 18, ferroelectric plug 26, and top electrode 28 are shown. Also shown in the plan view of FIG. 30A are the first via 32, second via 36, and the polysilicon gate contact 38.

Figure 31:
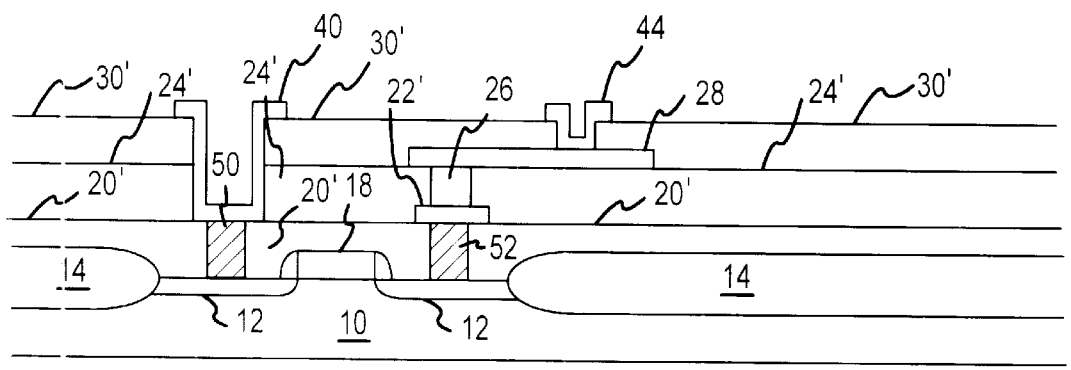

In FIG. 31, the first via 32 is metalized to form the bit line contact 40 of the memory cell, and the second via is metalized to form the plate line contact 44 of the memory cell. The polysilicon gate contact 38 is also metalized, but not shown in FIG. 31, to form the word line contact of the memory cell. The metalization can be performed simultaneously using an Al/TiN metalization as previously described.

The three methods of forming a ferroelectric capacitor stack described above with respect to FIGS. 1–31 can be further shielded from line degradation due to hydrogen exposure by "encapsulating" the top electrode. This optional encapsulation step may be useful in improving the yield of both packaged and unpackaged ferroelectric memory parts.

Figure 32:
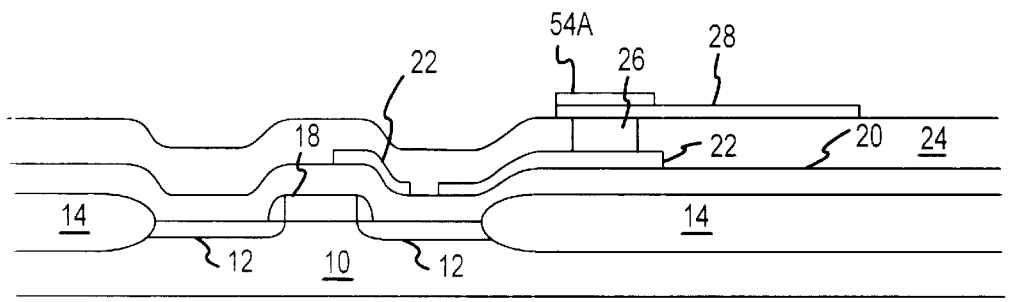
FIGS. 32–34 are cross-sectional views of encapsulation options for use with the top electrode in the first method of the present invention.
Figure 33:
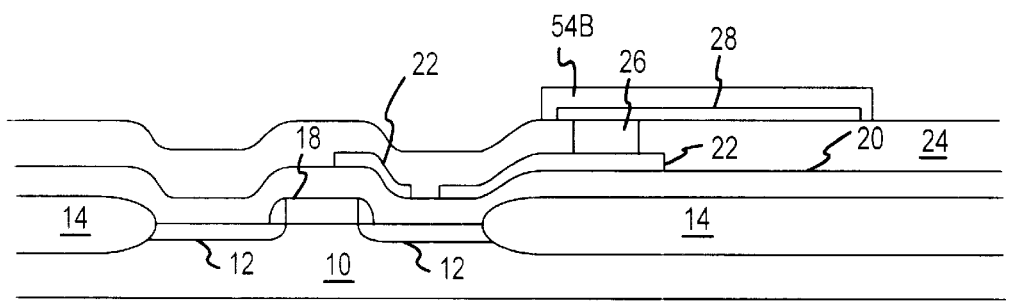
Figure 34:
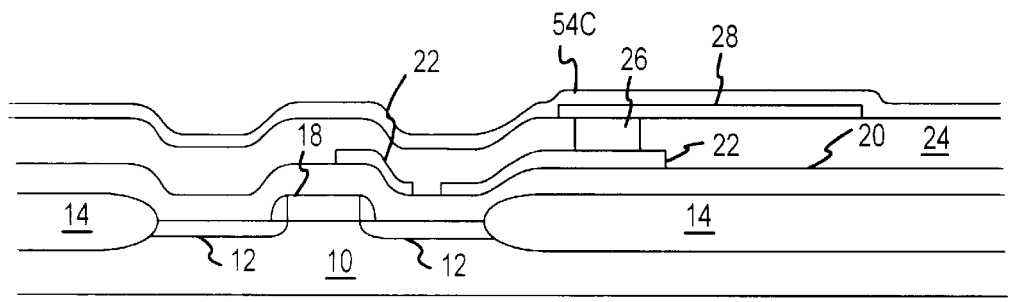

Turning now to FIGS. 32–34, three alternative techniques for encapsulating the top electrode 28 in the first method of the present invention are shown. FIGS. 32–34 correspond generally to a modification of FIG. 8, which is the point in the process where the top electrode 28 has been formed and patterned.

In FIG. 32, a first encapsulation layer 54A extends slightly beyond the lateral boundary of ferroelectric plug 26. Encapsulation layer 54A represents the minimum amount of material that is deemed to give measurable yield improvement in the finished ferroelectric memory. The material used is preferably any material that is a barrier to hydrogen, and is compatible with the other materials used in the process. A ferroelectric material may be used, and, for ease of manufacturability, the same one used to form ferroelectric plug 26. Any PZT, PLZT, SBT, or BST ferroelectric material may be used, either doped or undoped. Alternatively a ferroelectric material different than the ferroelectric material used in ferroelectric plug 26 may be used, but this will complicate the manufacturing process. Yet another alternative material alternative for encapsulation layer is alumina or silicon nitride. If a ferroelectric material is used, layer 54A may be patterned using conventional techniques for etching these materials such as plasma etching.

In FIG. 33 a second encapsulation layer 54B extends slightly beyond the lateral boundary of the top electrode 28. Encapsulation layer 54B represents an improvement in protection since the switching ferroelectric material in plug 26 is now further removed from possible contamination from the source of hydrogen. Encapsulation layer 54B is subsequently patterned to make contact to the top electrode 28.

In FIG. 34 a third encapsulation layer 54C extends completely over the surface of the integrated circuit memory. Although a continuous, unbroken layer is shown in FIG. 34, it is easily understood by those skilled in the art that this layer will be etched though to form the vias previously described. Encapsulation layer 54C represents the maximum protection possible, as it removes all potential paths of hydrogen contamination to ferroelectric plug 26.

For maximum protection against hydrogen-based line degradation, layers 54A, 54B, and 54C should be made as thick as possible, within reason. A suitable minimum thickness is about 1000 Angstroms.

Figure 35:
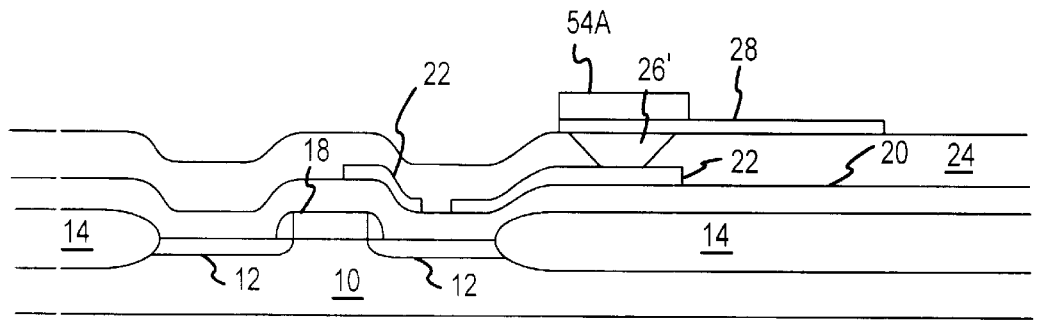
FIGS. 35–37 are cross-sectional views of encapsulation options for use with the top electrode in the second method of the present invention.
Figure 36:
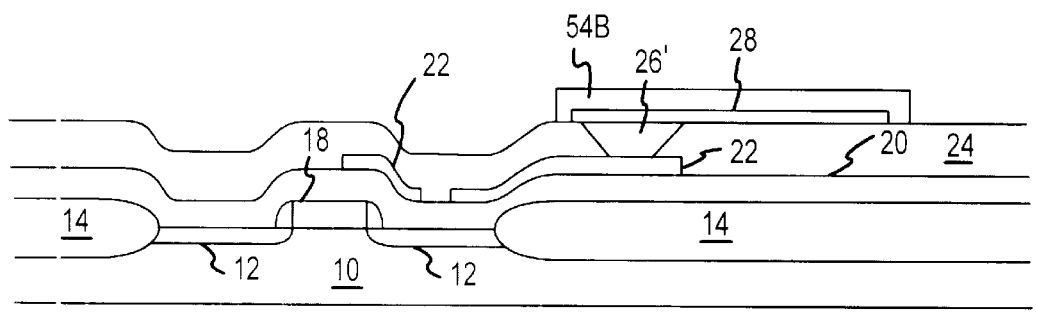
Figure 37:
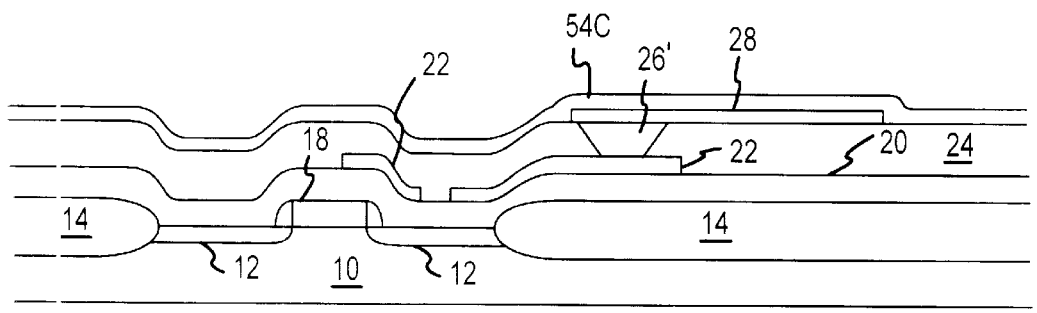

Three encapsulation layers 54A, 54B, and 54C are again shown in FIGS. 35–37 for isolating the V-shaped ferroelectric plug 26' from hydrogen contamination, thereby minimizing line degradation. FIGS. 35–37 generally correspond to a modification of FIG. 15, which is the point in the second method of the invention after which the top electrode 28 is formed. Encapsulation layer to 54A in FIG. 35 is the minimum needed for significant improvement in switching charge and yield, encapsulation layer 54B in FIG. 36 uses more material to completely encapsulate the top electrode 28, and encapsulation layer 54C in FIG. 37 completely covers the surface of the entire ferroelectric memory cell, which confers the maximum amount of protection against hydrogen degradation.

Figure 38:
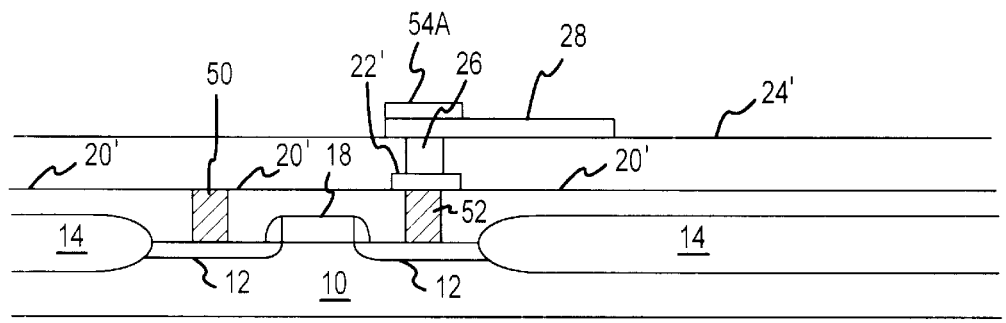
FIGS. 38–40 are cross-sectional views of encapsulation options for use with the top electrode in the third method of the present invention.
Figure 39:
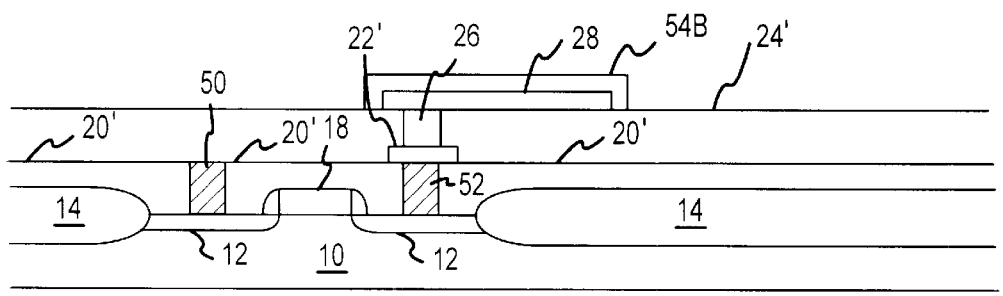
Figure 40:
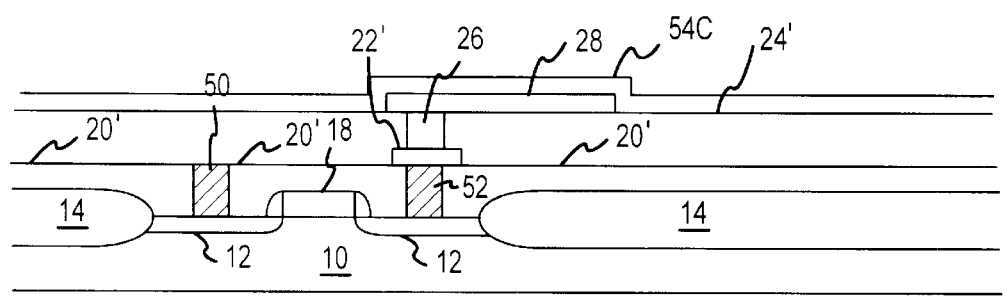

The encapsulation alternatives for the third method of the present invention are shown in FIGS. 38–40, which each correspond generally to the partially completed memory cell of FIG. 28. Encapsulation layer 54A in FIG. 38 is coextensive with or slightly overlapping ferroelectric plug 26, encapsulation layer 54B in FIG. 39 completely encapsulate the top electrode 28, and encapsulation layer 54C in FIG. 40 completely covers the surface of the entire ferroelectric memory cell.

A fourth method of forming a ferroelectric capacitor stack for use with an integrated circuit transistor in a ferroelectric memory cell according to the present invention is shown in FIGS. 41–45. It should be noted that in the fourth method of the present invention, a more conventional ferroelectric layer forms the ferroelectric capacitor dielectric, as opposed to a ferroelectric plug shown in the previous three methods.

Figure 41:
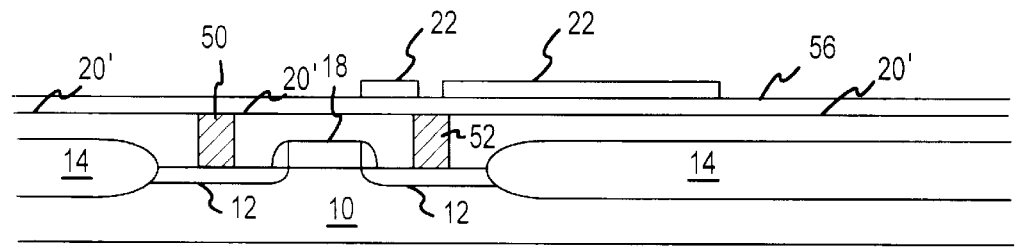
FIGS. 41–45 are cross-sectional views of an integrated circuit memory cell being formed according to a fourth method of the present invention.

In FIG. 41, a first planarized dielectric layer 20' is formed over the integrated circuit transistor. Layer 20' is etched and metal plugs 50 and 52 are formed as previously described with respect to FIG. 22. A second planarized dielectric layer 56 is formed over the first planarized dielectric layer 20' and first and second metal plugs 50 and 52. Dielectric layer 56 is preferably deposited silicon dioxide about 500 to 1500 Angstroms thick. However, other materials such as SiN or SiON can be used. Other methods for forming dielectric layer 56 such as PECVD can also be used.

Figure 42:
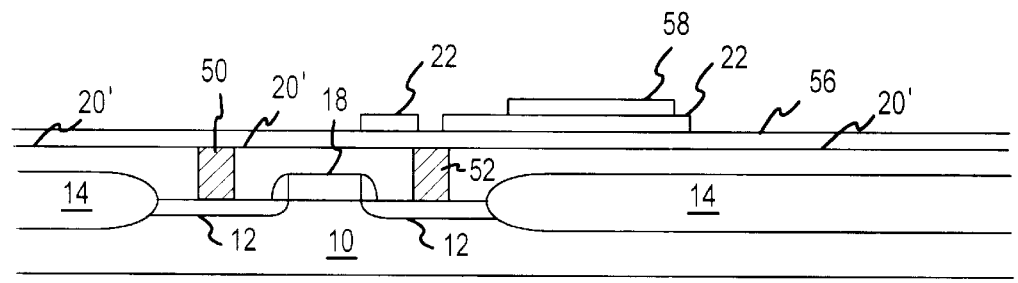

In FIG. 42, a bottom electrode 22 is formed over the second planarized dielectric layer 56. The bottom electrode is patterned and etched so that it has a hole located over the second metal plug 56. Note that in FIG. 42, although the bottom electrode 22 is etched, dielectric layer 56 is not etched and remains intact at this point in the process. Also in FIG. 42, a ferroelectric layer 58 is formed on the surface of the bottom electrode 22, generally above the thick field oxide region 14.

Perovskite crystal formation is achieved by an anneal performed at a temperature of about 650° C. for about an hour in an oxygen environment.

Figure 43:
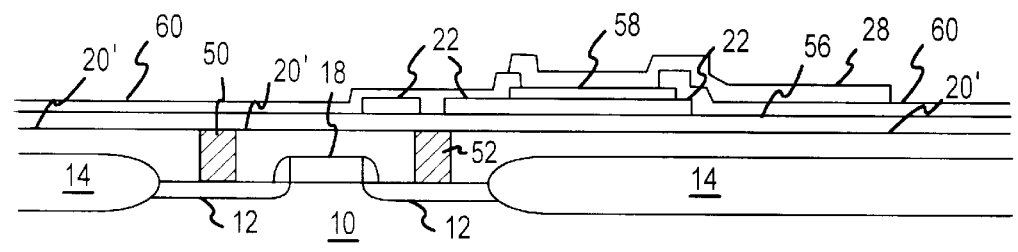

In FIG. 43 a patterned third dielectric layer 60 is formed, having a hole to provide access to the ferroelectric layer 58. Dielectric layer 60 is preferably silicon dioxide, about 1000–3000 Angstroms thick, but other materials such as alumina or silicon nitride can be used. It is typically formed using PECVD but sputtering can also be used. Also in FIG. 43, a platinum top electrode 28 is formed over the ferroelectric layer 58. The platinum top electrode layer 28 is patterned such that a portion of the top electrode extends over dielectric layer 60, and laterally away from the ferroelectric layer 58.

A recovery anneal is performed at a temperature of about 550° C. for about an hour in an oxygen environment.

Figure 44:
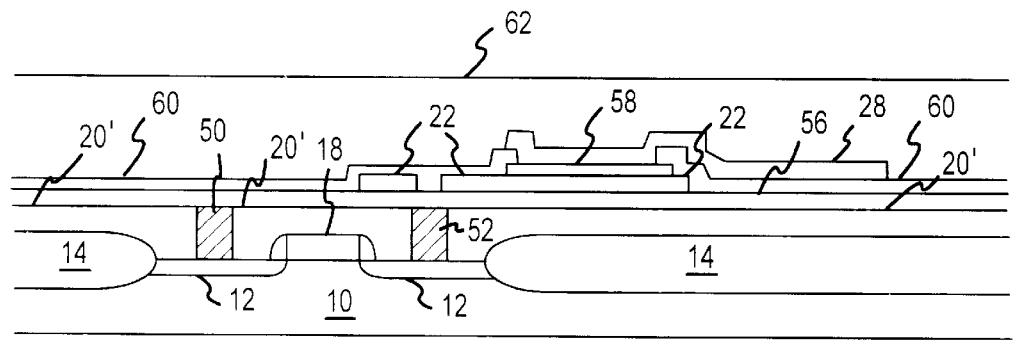

In FIG. 44 a fourth planarized dielectric layer 62 is formed over the third dielectric layer 60 and top electrode 28. Dielectric layer 62 is preferably silicon dioxide, formed by PECVD, and is approximately 3000 Angstroms thick. Other materials for dielectric layer 62 can be used, such as silicon nitride or alumina. Other methods for forming dielectric layer 62 can also be used, such as sputtering.

Figure 45:
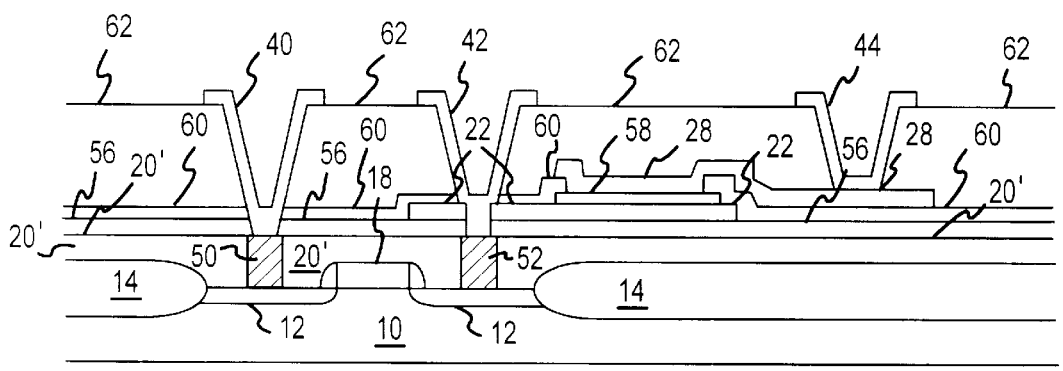

In FIG. 45, a first via is formed through the second, third, and fourth planarized dielectric layers 56, 60, and 62 to provide access to the first metal plug. The first via is metalized to form the bit line contact 40. A second via is formed through the second, third, and fourth planarized dielectric layers 56, 60, and 62, and through the hole in the bottom electrode 22, the via having sufficient width to provide access to a lateral edge of the hole in the bottom electrode 22. The second via is metalized to form the internal contact between the ferroelectric capacitor and the integrated circuit transistor in the memory cell. A third via is formed through the third planarized dielectric layer 62 to provide access to the top electrode 28. The third via is metalized to form plate line contact 44. In FIG. 45, the vias are ideally formed through plasma etching, and the metalization is preferably an Al/TiN sandwich, as previously described.

A fifth method of forming a ferroelectric capacitor stack for use with an integrated circuit transistor in a ferroelectric memory cell according to the present invention is shown in FIGS. 46–50.

Figure 46:
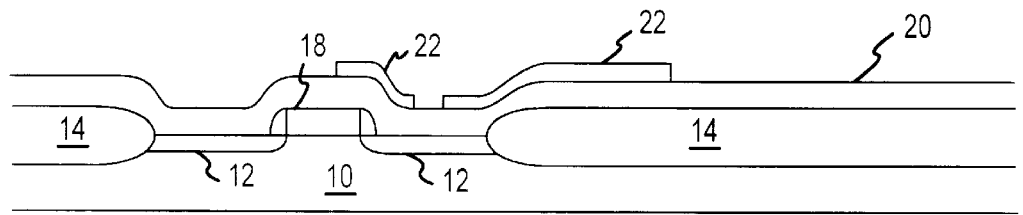
FIGS. 46–50 are cross-sectional views of an integrated circuit memory cell being formed according to a fifth method of the present invention.

In FIG. 46 a first dielectric layer 20 is formed over the integrated circuit transistor. Dielectric layer 20 is ideally a layer of BPSG about 5000 Angstroms thick. Also shown in FIG. 46 a platinum bottom electrode 22 is formed over the first dielectric layer 20. The bottom electrode 22 is patterned to have a hole located over a first source/drain 12 of the integrated circuit transistor.

Figure 47:
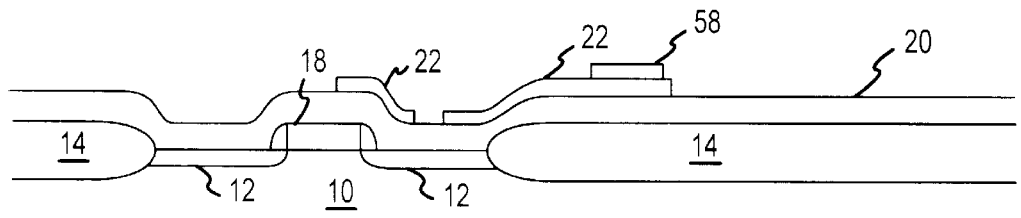

In FIG. 47 a PZT, PLZT, or other ferroelectric layer 58 is formed on the bottom electrode 22, generally located laterally over the thick field oxide 14.

Figure 48:
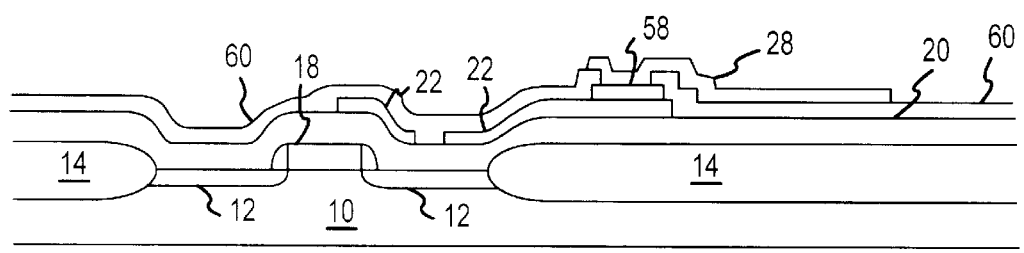

In FIG. 48 a second dielectric layer 60 is formed over the first dielectric layer 20 and bottom electrode 22. Dielectric layer 60 is preferably silicon dioxide, about 3000 Angstroms thick, formed by PECVD. A hole is etched in the second dielectric layer 60 to provide access to the ferroelectric layer 58. A platinum top electrode 28 is formed over the ferroelectric layer 58, and extending laterally over the dielectric layer 60.

Figure 49:
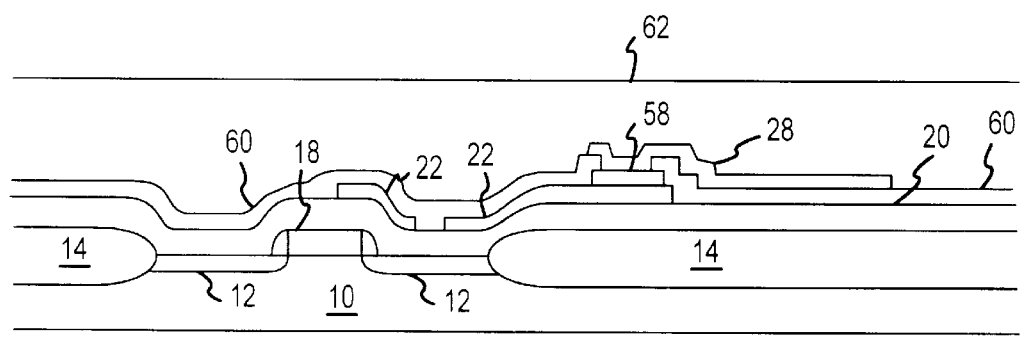

In FIG. 49 a planarized dielectric layer 62 is formed over the second dielectric layer 60 and top electrode 28. The planarized dielectric layer 62 is preferably silicon dioxide or silicon nitride and is deposited to a thickness of about 3000 Angstroms.

Figure 50:
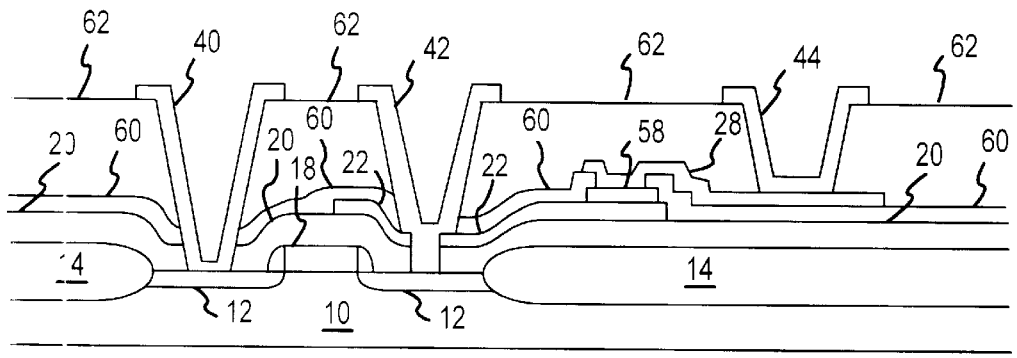

In FIG. 50 a first via is formed through the first, second, and planarized dielectric layers 20, 60, and 62 to provide access to the first source/drain 12. The first via is metalized to form bit line contact 40. A second via is formed through the first, second, and planarized dielectric layers 20, 60, and 62, and through the hole in the bottom electrode 22. The second via is etched to a sufficient width to provide electrical contact to a lateral edge of the hole in bottom electrode hole 22. The second via is subsequently metalized to form the internal contact 42 of the memory cell. Finally, a third via is formed through the planarized dielectric layer 62 to provide access to the top electrode 28. The third via is metalized to form the plate line contact 44. Contacts 40, 42, and 44 are preferably simultaneously metalized with an Al/TiN sandwich, along with a word line contact not shown in FIG. 50. Other metalization such as iridium and iridium alloys can be used if desired.

Figure 51:
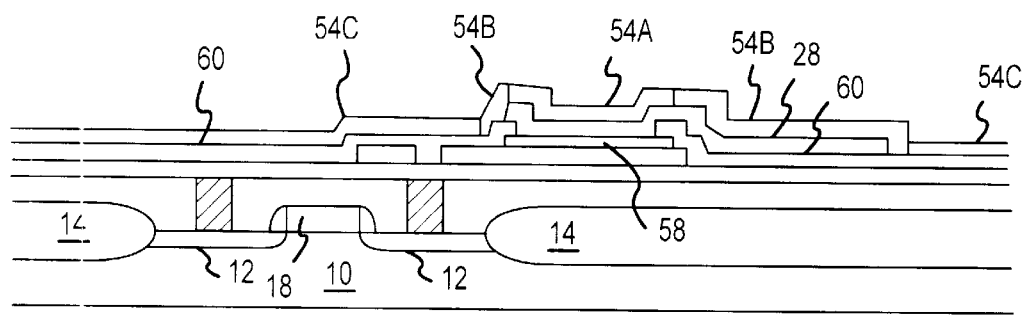
FIG. 51 is a cross-sectional view of encapsulation options for use with the top electrode in the fourth method of the present invention.
Figure 52:
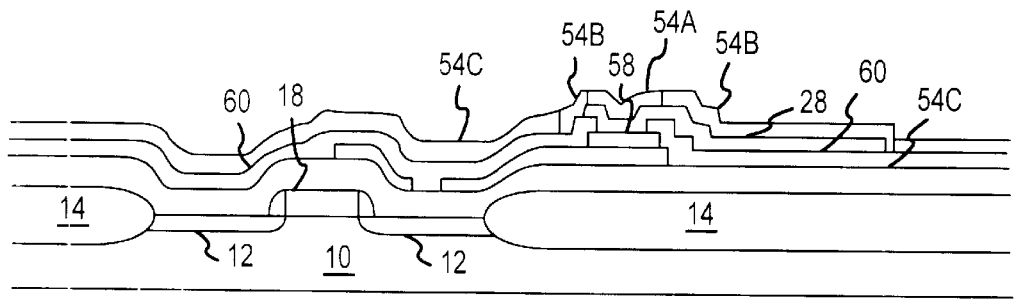
FIG. 52 is a cross-sectional view of encapsulation options for use with the top electrode in the fifth method of the present invention.

The encapsulation options for the fourth and fifth methods of the present invention are shown in FIGS. 51 and 52, respectively. A ferroelectric encapsulation layer 54A can be formed on the top electrode 28, approximately coextensive with a lateral boundary of the ferroelectric layer 58. The encapsulation layer can be laterally expanded to a ferroelectric encapsulation layer 54A+54B on the top electrode 28, overlapping a lateral boundary of the ferroelectric layer 58 and top electrode 28. Finally, forming a ferroelectric encapsulation layer 54A+54B+54C can be formed over the surface of the entire ferroelectric memory cell.

A sixth method of forming a ferroelectric capacitor stack for use with an integrated circuit transistor in a ferroelectric memory cell according to the present invention is shown with respect to FIGS. 53–57. The sixth method allows the ferroelectric plug 26 to be formed directly on the bottom electrode 22".

Figure 53:
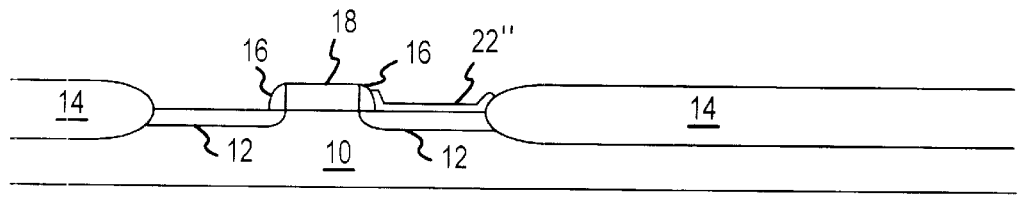
FIGS. 53–57 are cross-sectional views of an integrated circuit memory cell being formed according to a sixth method of the present invention.

In FIG. 53 a platinum or iridium-based bottom electrode 22" is formed over a first source/drain 12 of the integrated circuit transistor in the cell, including a suitable titanium-based or other adhesion layer.

Figure 54:
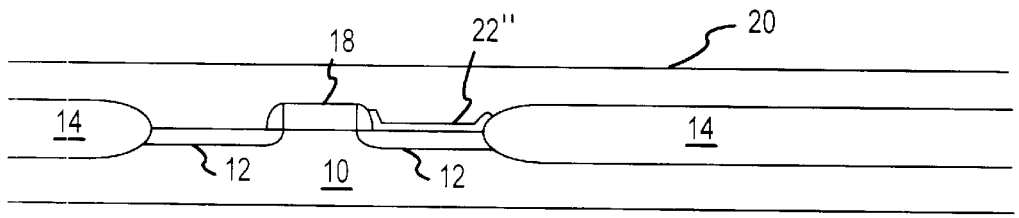

In FIG. 54 a first planarized dielectric layer 20 is formed over the integrated circuit transistor and bottom electrode 22".

Figure 55:
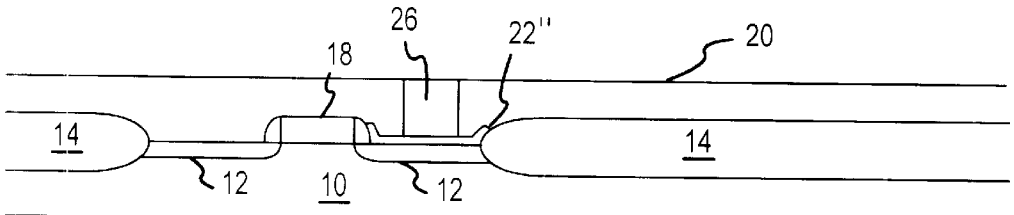

In FIG. 55 a hole in the first dielectric layer 20 is formed to provide access to the bottom electrode 22", and a ferroelectric plug 26 is subsequently formed in the hole in the first dielectric layer 20. The multiple ferroelectric layer deposit and etch-back system as previous described above may be used to form ferroelectric plug 26.

Figure 56:
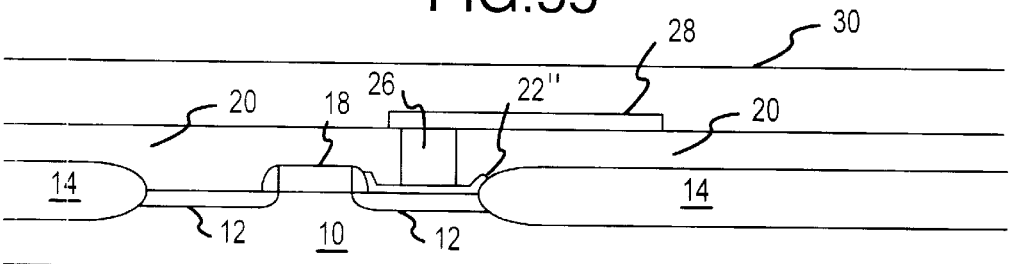
Figure 57:
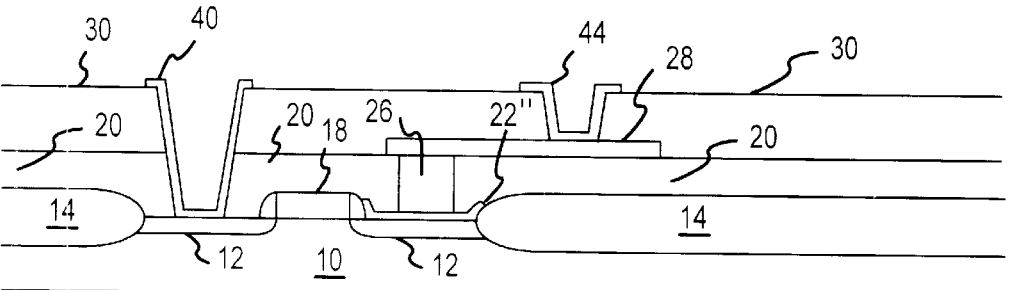

In FIG. 56, a platinum or iridium-based top electrode 28 is formed over the ferroelectric plug 26 and first dielectric layer 20. An alumina or ferroelectric or other hydrogen barrier encapsulation layer may be used over top electrode 28. As previously described above, the encapsulation layer may slightly overlap the lateral boundary of the ferroelectric plug 26, or may form an entire continuous layer over the surface of the partially formed ferroelectric memory cell, or may encompass patterned layers in between these two extremes. Encapsulation layers are shown generally in FIGS. 38–40.

Returning to FIG. 56, a second planarized dielectric layer 30 is formed over the first planarized dielectric layer 20 and top electrode 28. A first via is etched through the first and second planarized dielectric layers 20 and 30 to provide access to a second source/drain 12. The via is metalized to form bit line contact 40. A second via is etched through the second planarized dielectric layer 30 to provide access to the top electrode 28, and metalized to form plate line contact 44. The gate 18 is also contacted and metalized to form a word line contact, but is not shown in FIG. 56.

In conclusion, an integrated circuit ferroelectric memory cell has been shown comprising a transistor including first and second source/drains and a gate; a ferroelectric capacitor having a bottom electrode coupled to the second source/drain of the transistor, a ferroelectric dielectric, and a top electrode; a bit line contact coupled to the first source/drain of the transistor; a word line contact coupled to the gate of the transistor; and a plate line contact coupled to the top electrode. It is recommended that the plate line contact (top electrode contact) be spaced apart from the ferroelectric capacitor dielectric by at least five microns coupled to the top electrode. The ferroelectric dielectric of the ferroelectric capacitor in the cell can be a ferroelectric plug formed in a layer of silicon dioxide or silicon nitride, or other suitable dielectric material. Alternatively, the ferroelectric dielectric is a more standard patterned ferroelectric layer formed on the bottom electrode. The top electrode may also include an alumina or ferroelectric encapsulation layer. The bottom electrode may be formed directly on top of one of the transistor source/drains for a more compact memory cell. One or more layers of the memory cell are planarized so that the upper surface of the cell is substantially planar. In some configurations of the present memory cell, the bottom electrode is patterned to allow a via to be etched through for contact to the second/source drain of the transistor.

Having described and illustrated the principle of the invention in a preferred embodiment thereof, it is appreciated by those having skill in the art that the invention can be modified in arrangement and detail without departing from such principles. We therefore claim all modifications and variations coming within the spirit and scope of the following claims.

I claim:

1. An integrated circuit ferroelectric memory cell comprising:
    a transistor including first and second source drains and a gate;
    a ferroelectric capacitor having a bottom electrode coupled to the second source/drain of the transistor, a ferroelectric dielectric, and a top electrode;
    a bit line contact coupled to the first source/drain of the transistor;
    a word line contact coupled to the gate of the transistor; and
    a plate line contact spaced apart from the ferroelectric dielectric by at least five microns coupled to the top electrode.

2. An integrated circuit ferroelectric memory cell as in claim 1 in which the ferroelectric dielectric comprises a ferroelectric plug formed in a layer of silicon dioxide or silicon nitride.

3. An integrated circuit ferroelectric memory cell as in claim 1 in which the ferroelectric dielectric comprises a ferroelectric layer formed on the bottom electrode.

4. An integrated circuit ferroelectric memory cell as in claim 1 in which the top electrode further comprising an alumina or ferroelectric encapsulation layer.

5. An integrated circuit ferroelectric memory cell as in claim 1 in which the bottom electrode is formed directly on top of the second source/drain.

6. An integrated circuit ferroelectric memory cell as in claim 1 in which an upper surface of the cell is substantially planar.

7. An integrated circuit ferroelectric memory cell as in claim 1 in which the bottom electrode is patterned to allow a via to be etched through for contact to the second/source drain of the transistor.

* * * * *